United States Patent [19]
Busacco et al.

[11] Patent Number: 5,674,595
[45] Date of Patent: Oct. 7, 1997

[54] COVERLAY FOR PRINTED CIRCUIT BOARDS

[75] Inventors: Raymond Archie Busacco, Lake Ariel; Russell E. Darrow, Quaker Lake, both of Pa.; Paul G. Rickerl, Endicott, N.Y.

[73] Assignee: International Business Machines Corporation, Armonk, N.Y.

[21] Appl. No.: 635,848

[22] Filed: Apr. 22, 1996

[51] Int. Cl.⁶ ........................... B32B 9/00
[52] U.S. Cl. .................. 428/209; 361/748; 361/749; 174/258; 174/259; 428/901
[58] Field of Search ................. 428/209, 338, 428/901, 343, 344, 339; 361/748, 749; 174/259, 258

[56] References Cited

U.S. PATENT DOCUMENTS

| | | |
|---|---|---|
| 4,568,592 | 2/1986 | Kawguchi ........................ 428/338 |
| 4,762,747 | 8/1988 | Liu et al. . |
| 5,084,124 | 1/1992 | Taniguchi . |
| 5,344,893 | 9/1994 | Asai ........................ 428/209 |
| 5,502,889 | 4/1996 | Casson ........................ 174/259 |
| 5,514,449 | 5/1996 | Tingerthal ........................ 428/209 |

OTHER PUBLICATIONS

Webster's II, New Riverside Dictionary pp. 78, 1177.

*Primary Examiner*—Patrick Ryan
*Attorney, Agent, or Firm*—Calfee, Halter & Griswold LLP

[57] ABSTRACT

A flexible circuit board having an improved protective coverlay is provided. The product flexible circuit board comprises a flexible, dielectric substrate, one or more electrical conductors carried on the surface thereof, one or more electrical contact bumps in electrical communication with the conductors, and an improved protective coverlay electrically insulating the electrical conductors. The coverlay, which is a solid, tack-free film bonded to the surface of the dielectric substrate, is formed in situ from one or more layers of flexible, dielectric, polymeric adhesives and avoids the use of a pre-formed, self-supporting film.

18 Claims, 1 Drawing Sheet ly, this invention relates to flexible circuit board having a thin protective coverlay which is formed solely in situ from flexible dielectric adhesive polymers.

COVERLAY FOR PRINTED CIRCUIT BOARDS

FIELD OF THE INVENTION

This invention relates generally to a flexible circuit board having an improved protective coverlay which electrically insulates the conductors carried on the surface-thereof. More particularly, this invention relates to flexible circuit board having a thin protective coverlay which is formed solely in situ from flexible dielectric adhesive polymers.

BACKGROUND OF THE INVENTION

Flexible printed circuit boards are widely used in consumer and industrial appliances and in appliances for telecommunications. Such boards comprise a flexible, dielectric substrate, one or more conductors carried on at least one surface of the substrate, a coverlay electrically insulating the conductors, and one or more electrical contacts in electrical communication with the conductors and extending through and beyond the coverlay.

Typically, the circuit boards are assembled first by plating the electrical contacts onto the surface of the substrate and in electrical communication with the conductors. Then a composite for forming the coverlay is laminated to the surface of the substrate, the composite having apertures for receiving the electrical contacts on the substrate. The composite comprises a pre-formed, polyimide film and a coating of adhesive. Accordingly, the resulting coverlay comprises two layers with one layer being the pre-formed polyimide film and the other layer being a layer of adhesive. If the other major surface of the substrate carries electrical contacts, a composite is usually laminated to that surface also.

In order to provide suitable dielectric strength, coverlays made from adhesively-bonded pre-formed polyimide films employ polyimide films at least 1 mil thick. Unfortunately, this has led to practical limitations in terms of the thinness and flexibility of the product circuit boards employing such coverlays, since the coverlay itself represents a significant part of the thickness of the final product. This problem is only exacerbated when a coverlay is provided on both sides of the substrate.

Because of the continued trend towards miniaturization and because of a growing diversity in applications, flexible circuit boards must meet increasingly more stringent requirements in terms of thinness and flexibility. Unfortunately, this has become more and more difficult with respect to flexible circuit boards having polyimide film coverlays of conventional design due to the inherent limitations on flexibility and thinness imposed by these materials.

Accordingly, a flexible printed circuit board having a new coverlay design would be highly desirable, especially a coverlay design which allows a reduction in thickness and a concomitant increase in flexibility of the product circuit board produced.

SUMMARY OF THE INVENTION

In accordance with the present invention, an improved flexible circuit board having a novel coverlay is provided. This coverlay is composed of a flexible, dielectric polymeric adhesive. The coverlay is formed in situ on the flexible circuit board substrate.

In accordance with the present invention, it has been determined that the dielectric strength of the polymeric adhesives typically used in manufacturing prior art coverlays is sufficient for a significant number of applications. Accordingly, the present invention avoids using pre-formed polyimide (or other polymer) films as a fundamental component of the coverlay. As a result, the product flexible circuit boards formed from the inventive coverlay can be made thinner and more flexible than their prior art counterparts since the self-supporting polyimide layer has been totally eliminated from the coverlay.

BRIEF DESCRIPTION OF THE DRAWINGS

The present invention may be more readily understood by reference to the drawings wherein.

DETAILED DESCRIPTION

Figure 1:
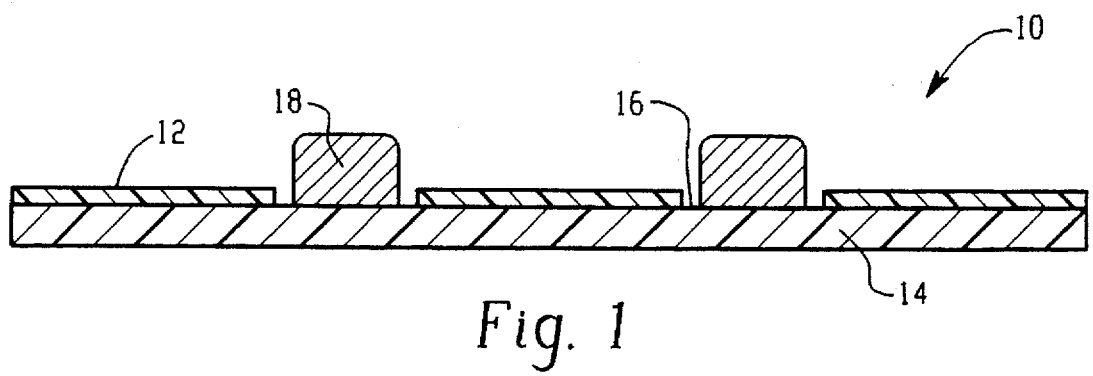
FIG. 1 is a cross-sectional view, somewhat schematic, of a product flexible circuit board produced in accordance with the present invention.

An improved flexible circuit board produced in accordance with the present invention is displayed in FIG. 1. The product flexible circuit board, shown generally as 10, comprises coverlay 12, dielectric substrate 14 having a surface 16 thereof, at least one electrical conductor (not shown) on surface 16, and at least one electrical contact, such as contact bump 18, plated on surface 16 and in electrical communication with one or more electrical conductors thereon. Dielectric substrate 14 typically is formed from a polymeric material, such as a polyimide, which is flexible and has a high dielectric strength. Contact bump 18 typically is formed from copper or a copper alloy. The conductors also are typically formed from copper or a copper alloy.

Coverlay 12 is a solid, tack-free film comprising one or more layers, each of which is formed from one or more flexible dielectric adhesive polymers. As used herein, "polymer" includes homopolymers, co-polymers, terpolymers, etc. Preferably, coverlay 12 comprises a single layer formed from one dielectric adhesive polymer or from a mixture of dielectric adhesive polymers.

Suitable adhesive polymers are those that have a dielectric strength sufficient to prevent shorting between the electrical conductors on surface 16 of flexible circuit board 10 and other electrical components in close proximity to flexible circuit board 10. Preferably, the dielectric strength of the adhesive is at least 500 volts/mil as determined by ASTM D-149. Suitable adhesive polymers should also adhere to dielectric substrate 14 and the electrical conductors carried on surface 16. Preferred adhesive polymers have a peel strength of at least 875 N/m or 5.0 lb/in, as measured by method 2.4.9 of the Institute for Interconnecting and Packaging Electronic Circuits TM-650. Preferred adhesive polymers are also capable of melting when heated. These adhesives may also be capable of curing, and if a curable adhesive polymer is used in accordance with the present invention, it should not be in a fully-cured state prior to engagement with the substrate. Suitable adhesive polymers include, for example, acrylic polymers, polyesters, thermoplastic and thermosetting polyimides, epoxies, and butyral phenolics. One preferred adhesive is the butyral phenolic adhesive sold in the form of a composite by the Rogers Corporation of Chandler, Ariz. as "8970". Another preferred adhesive is the acrylic adhesive in the three-layer composite sold by the Sheldahl Corporation, of Northfield, Minn., under the designation "T-1615."

The thickness of coverlay 12 is dependent on both the height of contact bumps 18 and the thickness of the conductors. To ensure that coverlay 12 is capable of preventing shorting between flexible circuit 10 and other electrical components during operation, it is desirable that coverlay 12 completely cover the conductors. To ensure good electrical contact between flexible circuit 10 and other electrical components, it is desirable that the contact bumps extend beyond the coverlay. Accordingly, it is preferred that coverlay 12 be thinner than the height of contact bumps 18. Preferably, coverlay 12 has a thickness of about 1 mil or less, for example 0.5 to 0.95 mil, or 0.6 to 0.9 mil.

Although any conventional method can be used to bond coverlay 12 to substrate 14, it is preferred that coverlay 12 be formed in situ by heat and press lamination of the dielectric adhesive polymers to surface 16 of substrate 14 and to the electrical conductors carried on surface 16.

Figure 2:
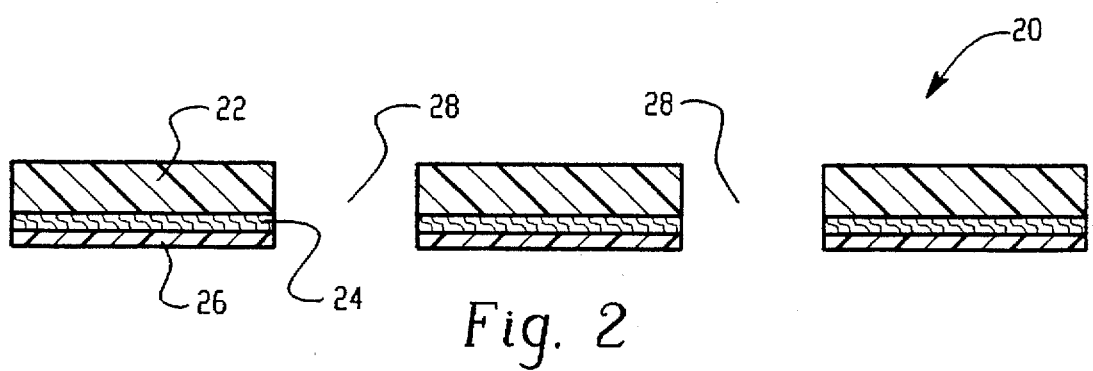
FIG. 2 is a cross sectional view illustrating the composite used to form the coverlay of the product flexible circuit board illustrated in FIG. 1.

In the preferred embodiment, flexible circuit board 10 is formed by using the composite, shown generally as 20, in FIG. 2. In one embodiment of the invention the composite sold under the tradename T-1615 by Sheldahl Corporation can be used as composite 20. Composite 20 includes release layer 22, adhesive layer 24, and protective sheet 26. Adhesive layer 24 is a layer of acrylic adhesive that is a partially-cured, dry, tack-free film capable of bonding to another material and being further cross-linked under heat and pressure, thereby making it more resistant to chemical attack. Release layer 22 and protective sheet 26 can be formed from any material which will function as indicated below, although in the specific embodiment illustrated, release layer 22 is formed from a self-supporting polyester sheet and protective sheet 26 is a polyethylene sheet.

Figure 3:
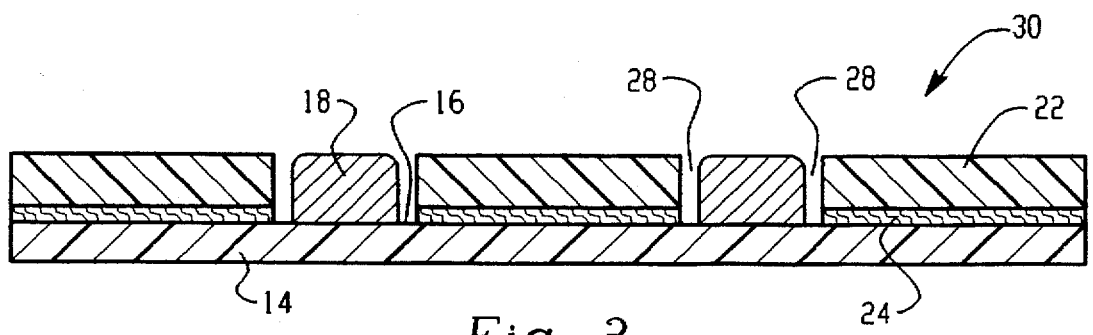
FIG. 3 is a cross-sectional view of the composite of FIG. 2 shown during lamination of the composite to a flexible circuit board preform for forming the product flexible circuit board of FIG. 1.

Apertures 28 corresponding in shape and position to contact bumps 18 carried on surface 16 of substrate 14 are formed simultaneously in all three layers of composite 20. For ease of application, it is preferred that apertures 28 have a larger diameter than contact bumps 18. Apertures 28 are formed by conventional methods such as drilling or punching-out. Then, protective sheet 26 is removed from composite 20 to uncover adhesive layer 24, usually by manual peeling. Thereafter, adhesive layer 24 and release layer 22 are brought into engagement with substrate 14 with apertures 28 in registration with contact bumps 18 to provide the structure, shown generally as 30, in FIG. 3. Structure 30 is subjected to sufficient heat and pressure to laminate adhesive layer 24 and release layer 22 to surface 16 of substrate 14 and the conductors carried on surface 16. During application of the heat and pressure, the thickness of adhesive layer 24 is reduced. After the heat and pressure are removed from structure 30, release layer 22 is removed, typically by manual stripping, from structure 30 to provide the product flexible circuit board 10, as shown in FIG. 1.

The above described process provides a flexible circuit board having a protective coverlay which is formed in situ on the circuit board substrate. By being formed "in situ" is meant that each layer of the coverlay undergoes either a chemical and/or a physical change during formation of the coverlay in situ. Each layer of the coverlay either is cured, i.e., further cross-linked, and/or is changed in shape during formation of the coverlay in situ. Typically, each layer becomes thinner during formation of the coverlay. Each layer may also become wider and/or longer.

In contrast, the typical prior art coverlay includes a pre-formed polyimide film, i.e., a polyimide film which is fully cured prior to application to the circuit board substrate. Thus, the pre-formed polyimide film does not undergo either a chemical change and/or a physical change during lamination of the coverlay to the circuit board substrate. Accordingly, the prior art coverlay is not formed solely in situ. Moreover, the pre-formed polyimide film is not capable of bonding to the substrate without having an additional layer of adhesive disposed between the pre-formed polyimide film and the substrate. This means that the product coverlay must contain at least two distinct layers, the pre-formed polyimide film and the adhesive layer.

In the present invention the preformed polyimide layer is not used. Therefore, the present coverlay may be thinner than the typical prior art coverlay, and the product flexible circuit boards made with the present coverlay may also be thinner and more flexible than their prior art counterparts.

While the invention has been described to some degree of particularity, various adaptations and modifications can be made without departing from the scope of the invention as defined in the appended claims.

What is claimed is:

1. A flexible circuit board comprising:

a flexible dielectric substrate carrying at least one electrical conductor and at least one contact bump on at least one surface of said substrate; wherein said conductor is in electrical communication with said bump; and a coverlay bonded to said surface of said substrate and formed in situ, said coverlay comprising at least one flexible dielectric adhesive polymer present on said surface in solid form; wherein said coverlay is free of a conductive material and free of a pre-formed film.

2. The flexible circuit board of claim 1, wherein the thickness of said coverlay is less than the height of said contact bump above the surface of said substrate.

3. The flexible circuit board of claim 1, wherein said dielectric adhesive polymer is selected from the group consisting of acrylic adhesive polymers, epoxy adhesive polymers, butyral phenolic adhesive polymers, polyester adhesive polymers and polyimide adhesive polymers.

4. The flexible circuit board of claim 1, wherein said dielectric adhesive polymer has a peel strength of 5.0 lb/in.

5. The flexible circuit board of claim 1, wherein said dielectric adhesive polymer has a dielectric strength of 500 volts/mil.

6. The flexible circuit board of claim 1, wherein said coverlay is about 1 mil in thickness.

7. The flexible circuit board of claim 1, wherein said coverlay is from about 0.5 to 0.95 mil in thickness.

8. The flexible circuit board of claim 7, wherein said coverlay is from about 0.6 to 0.9 mil in thickness.

9. A flexible circuit board comprising:

a flexible dielectric substrate carrying at least one electrical conductor and at least one contact bump on at least one surface of said substrate; wherein said conductor is in electrical communication with said bump; and a coverlay bonded to said surface of said substrate and formed in situ, said coverlay comprising a single layer of at least one flexible dielectric adhesive polymer present on said surface in solid, form; wherein said coverlay is free of a conductive adhesive material and free of a pre-formed film and wherein the thickness of said coverlay is less than the height of said contact bump above the surface of said dielectric substrate.

10. The flexible circuit board of claim 9, wherein said dielectric adhesive polymer is selected from the group consisting of acrylic adhesive polymers, epoxy adhesive polymers, butyral phenolic adhesive polymers, polyester adhesive polymers and polyimide adhesive polymers.

11. The flexible circuit of claim 9 wherein said coverlay comprises an acrylic adhesive polymer.

12. The flexible circuit of claim 9, wherein said coverlay comprises a butyral phenolic adhesive polymer.

13. The flexible circuit board of claim 9, wherein said dielectric adhesive polymer has a peel strength of 5.0 lb/in.

14. The flexible circuit board of claim 9, wherein said dielectric adhesive polymer has a dielectric strength of 500 volts/mil.

15. The flexible circuit board of claim 9, wherein said coverlay is about 1 mil in thickness.

16. The flexible circuit board of claim 9, wherein said coverlay is from about 0.5 to 0.95 mil in thickness.

17. The flexible circuit board of claim 16, wherein said coverlay is from about 0.6 to 0.9 mil in thickness.

18. The flexible circuit board of claim 9, wherein said coverlay comprises a mixture of dielectric adhesive polymers.

* * * * *